(12) United States Patent
Malvar

(10) Patent No.: US 7,991,622 B2
(45) Date of Patent: *Aug. 2, 2011

(54) AUDIO COMPRESSION AND DECOMPRESSION USING INTEGER-REVERSIBLE MODULATED LAPPED TRANSFORMS

(75) Inventor: Henrique S. Malvar, Redmond, WA (US)

(73) Assignee: Microsoft Corporation, Redmond, WA (US)

(*) Notice: Subject to any disclaimer, the term of this patent is extended or adjusted under 35 U.S.C. 154(b) by 1001 days.

This patent is subject to a terminal disclaimer.

(21) Appl. No.: 11/688,851

(22) Filed: Mar. 20, 2007

(65) Prior Publication Data

US 2008/0234845 A1    Sep. 25, 2008

(51) Int. Cl.
G10L 21/04    (2006.01)
G10L 19/02    (2006.01)
G10L 19/00    (2006.01)

(52) U.S. Cl. ........ 704/504; 704/201; 704/203; 704/204; 704/503

(58) Field of Classification Search .......... 704/200–201, 704/503–504
See application file for complete search history.

(56) References Cited

U.S. PATENT DOCUMENTS

| | | | | |
|---|---|---|---|---|
| 5,839,100 | A * | 11/1998 | Wegener | 704/220 |
| 6,240,380 | B1 | 5/2001 | Malvar | |
| 6,778,965 | B1 | 8/2004 | Bruekers et al. | |
| 7,126,506 | B2 | 10/2006 | Malvar | |
| 7,133,832 | B2 | 11/2006 | Heo | |
| 7,283,967 | B2 | 10/2007 | Nishio | |
| 7,318,027 | B2 * | 1/2008 | Lennon et al. | 704/229 |
| 7,333,929 | B1 * | 2/2008 | Chmounk et al. | 704/200 |
| 7,340,391 | B2 * | 3/2008 | Herre et al. | 704/200.1 |
| 7,395,210 | B2 * | 7/2008 | Li | 704/500 |
| 7,483,581 | B2 | 1/2009 | Raveendran | |
| 7,536,305 | B2 * | 5/2009 | Chen et al. | 704/500 |
| 2004/0044534 | A1 | 3/2004 | Chen | |
| 2005/0083216 | A1 | 4/2005 | Li | |
| 2005/0131660 | A1 | 6/2005 | Yadegar | |
| 2005/0180586 | A1 * | 8/2005 | Kim et al. | 381/106 |
| 2005/0192799 | A1 | 9/2005 | Kim | |
| 2005/0203731 | A1 | 9/2005 | Oh | |
| 2005/0231396 | A1 * | 10/2005 | Dunn | 341/50 |
| 2006/0103556 | A1 | 5/2006 | Malvar | |
| 2006/0257036 | A1 | 11/2006 | Hou | |

OTHER PUBLICATIONS

Ashland, M. T., Monkey's audio: a fast and powerful lossless audio compressor, available at http://www.monkeysaudio.com.

(Continued)

Primary Examiner — Matthew J Sked
(74) Attorney, Agent, or Firm — Lyon & Harr, LLP; Mark A. Watson

(57) ABSTRACT

A "STAC Codec" provides lossless audio compression and decompression by processing an audio signal using integer-reversible modulated lapped transforms (MLT) to produce transform coefficients. Transform coefficients are then encoded using a backward-adaptive run-length Golomb-Rice (RLGR) encoder to produce losslessly compressed audio signals. In additional embodiments, further compression gains are achieved via an inter-block spectral estimation and data sorting strategy. Further, compression in the transform domain allows the bitstream to be partially decoded, using the corresponding RLGR decoder, to reconstruct the frequency-domain coefficients. These frequency-domain coefficients are then directly used to speed up various transform-domain based applications such as transcoding media to lossy or other formats, search, identification, visualization, watermarking, etc. In other embodiments, near-lossless compression is achieved by right-shifting transform coefficients by some number of bits such that quantization errors are not perceived as distortion in the decoded audio signal.

19 Claims, 5 Drawing Sheets

OTHER PUBLICATIONS

Brandenburg, K., and T. Sporer, NMR and Masking Flag: Evaluation of quality using perceptual criteria, Proc. 11th Int. AES Conf., May 1992, pp. 169-179, Portland, OR.

Burges, C. J. C., D. Plastina, J. Platt, E. Renshaw, and H. S. Malvar, Using audio fingerprinting for duplicate detection and thumbnail generation, Proc. Int. Conf. Acoustics, Speech, Signal Processing, vol. III, Mar. 2005, pp. 9-12, Philadelphia, PA.

Coalson, J., FLAC—Free Lossless Audio Codec, available at http://flac.sourceforge.net.

Ghido, F., Ghido's data compression page, available at http://www.losslessaudio.org.

Giurcaneanu, C., I. Tabus, and J. Astola, Integer wavelet transform based lossless audio compression, Proc. of the IEEE-EURASIP Workshop on Nonlinear Signal and Image Processing (NSIP'99), Jun. 20-23, 1999, pp. 378-382, Antalya, Turkey.

Huang, H., S. Rahardja, Integer MDCT with enhanced approximation of the DCT-IV, IEEE Trans. on Signal Processing, Mar. 2006, pp. 1156-1159, vol. 54.

Hydrogen Audio: Lossless comparison, available at http://wiki.hydrogenaudio.org/index.php?title=Lossless_comparison.

Hydrogen Audio: "Monkey's Audio," available at http://wiki.hydrogenaudio.org/index.php?title= Monkey's_Audio.

Kim, J., Lossless wideband audio compression: Prediction and transform, Communication Engineering, Technical University Berlin, Germany, 2003.

Krishnan, T., and S. Oraintara, Fast and lossless implementation of the forward and inverse MDCT computation in MPEG audio coding, Proc. Int. Symp. Circuits and Systems, May 2002, pp. 181-184, vol. 2, Scottsdale, AZ.

Li, J., A progressive to lossless embedded audio coder (PLEAC) with reversible modulated lapped transform, Proc. Int. Conf. Acoustics, Speech, Signal Processing, Apr. 2003, pp. 221-224, Hong Kong, vol. III.

Li, J., Low noise reversible MDCT (RMDCT) and its application in progressive-to-lossless embedded audio coding, IEEE Trans. on Signal Processing, May 2005, pp. 1870-1880, vol. 53.

Liebchen, T., and Y. Reznik, MPEG-4 ALS: an emerging standard for lossless audio coding, Proc. Data Compression Conf., Mar. 2006, pp. 439-448, Snowbird, UT.

Malvar, H. S., Adaptive run-length/Golomb-Rice encoding of quantized generalized Gaussian sources with unknown statistics, Proc. Data Compression Conf., Mar. 2006, pp. 23-32, Snowbird, UT.

Robinson, A. J., Shorten: Simple lossless and near-lossless waveform compression, Tech. Rep. CUED/F-INFENG/TR.156, Cambridge University Eng. Dept., Dec. 1994.

Wikipedia: Audio data compression, available at: http://en.wikipedia.org/wiki/Audio_data_compression.

Yokotani, Y., R. Geiger, G.D.T. Schuller, S. Oraintara, K. R. Rao, Lossless audio coding using the IntMDCT and rounding error shaping, IEEE Transactions on Audio, Speech, and Language Processing, Nov. 2006, pp. 2201-2211, vol. 14, No. 6.

Yu, R., X. Lin, S. Rahardja, and C. C. Ko, A statistics study of the MDCT coefficient distribution for audio, Proc. IEEE Int. Conf. on Multimedia and Expo, Jun. 2004, pp. 1483-1486, vol. 2, Taipei, Taiwan.

Yu, R., S. Rahardja, L. Xiao, and C. C. Ko, A fine granular scalable to lossless audio coder, IEEE Trans. on Audio, Speech, and Language Processing, Jul. 2006, pp. 1352-1363, vol. 14.

Ritz, C. H., J. Parsons, Lossless wideband speech coding, Proceedings of the 10th Australian Int'l Conf. on Speech Science & Tech., Macquarie University, Sydney, pp. 249-252, Dec. 8-10, 2004.

International Search Report, Application No. PCT/US2008/057657, completed Aug. 22, 2008, mailed Aug. 22, 2008.

Wozniak, James S., U.S. Appl. No. 11/688,852, U.S. Office Action, Apr. 15, 2010.

Sked, Matthew J., USPTO Office Action dated Sep. 22, 2010 for U.S. Appl. No. 11/688,852.

\* cited by examiner

AUDIO COMPRESSION AND DECOMPRESSION USING INTEGER-REVERSIBLE MODULATED LAPPED TRANSFORMS

BACKGROUND

1. Technical Field

The invention is related to audio compression, and in particular, to a system and method that provides transform domain compression of audio signals using an integer-reversible modulated lapped transform (MLT) to transform audio signals into the transform domain in combination with a backwards-adaptive entropy coder to compress the resulting transform coefficients of the audio signal to produce a compressed bitstream.

2. Related Art

Personal digital music libraries are becoming larger as the popularity of portable media players continues to grow. However, the audio files in such libraries are often compressed to limit storage requirements. For example, a typical 4-*minute* stereo music track, when stored in a raw CD format, requires around 42 MBytes of storage space. As such, a 5,000 track library (averaging 4 minutes per song) requires over 200 GBytes to store the uncompressed audio. Consequently, such audio libraries are typically compressed using lossless and/or lossy encoders to limit overall storage requirements. Further, when transferring music files to a portable digital music player or the like, those music files are often transcoded from a lossless mode to a lossy mode due to storage limitations on the portable device.

There are a large number of well known audio compression techniques. Many of these techniques are based on the use of forward-adaptive prediction followed by forward-adaptive entropy coding wherein the prediction and encoding parameters are pre-computed and then applied to an entire block of signal samples. For example, one such technique operates by decomposing the audio into short blocks (typically with 256 samples), then applying linear prediction (LP) or a low-order polynomial predictor to the blocks. The prediction residuals are encoded then using the well known Golomb-Rice (GR) encoder to produce a compressed bitstream. To allow decoding of the compressed bitstream, each block in the compressed bitstream includes a header area that stores an index to the kind of prediction used, the values of the prediction coefficients, and the value of the GR parameter, followed by the encoded residuals. In a related implementation, a "near-lossless" mode is enabled by right-shifting the samples in each block by n bits, where n is adaptively changed from block-to block, to maintain a specified signal-to-noise ratio per block.

Unfortunately, there are significant disadvantages to using predictive coding for audio compression. For example, in many audio segments there are periodic tones which cannot be efficiently predicted by low-order predictors. The use of very high order predictors is not a feasible solution, since in short audio frames there is typically not enough data for reliable convergence of algorithms for finding optimal prediction coefficients. Similarly, the use of pitch predictors (as in speech coders) does not work well with music since there are frequently several simultaneous tones. In addition, with lossy compression, most conventional lossy compression techniques use a transform front-end. Consequently, the only way to transcode an encoded audio signal (encoded using predictive coding) from a lossless into a lossy format requires full decoding of the lossless samples followed by a full re-encoding of the audio signal using transform-based lossy encoding.

Frequency-domain coding using fast transforms has been used to address some of the disadvantages of using predictive coding to compress audio signals. For example, if an audio frame has dominant tones, than most of the energy in the frequency domain is concentrated in a few transform coefficients, allowing for efficient compression. Further, if the same transform that is used for lossy coding is also used for lossless coding, fast transcoding can be achieving by simply decoding the transform coefficients and then re-encoding those coefficients using a lossy coder without ever needing to fully decode into the time domain signal. Consequently, the use of frequency-domain coding (also referred to as "transform coding") allows codecs to transcode compressed audio signals from lossless to lossy modes entirely in the frequency domain, without requiring any transform computations for the transcoding operations.

A number of conventional lossless transform coding techniques, while working reasonably well for transcoding operations, fail to provide good compression characteristics. Specifically, with lossless compression using transform coding, the transforms must be exactly reversible in integer arithmetic. Some well known direct approaches for integer transforms have applied a lifting-based integer-invertible (or integer-reversible) technique that works well for short-length transforms such as those used in image compression, but for larger transform lengths such as those used for audio compression (e.g., 256 to 4096 samples), the accumulation of rounding errors leads to a significant drop in lossless compression, or excessive noise in lossy compression.

Some of these problems have been addressed using "matrix lifting" techniques which allow the computation of an integer-reversible modulated lapped transform (MLT), also known as a modified discrete cosine transform (MDCT). Even for large block sizes, these matrix lifting-based techniques are capable of computing integer MLTs whose coefficient values are generally within a relatively small error range relative to corresponding real-valued MLT coefficients. As a result, both compression performance for lossless compression and reduction of noise in lossy compression is improved.

Unfortunately, as is known to those skilled in the art, typical matrix lifting-based transform coding techniques require coding parameters to be computed or estimated from the input data and added to the compressed bitstream as side information. As a result, additional computation is required, resulting in increased computational overhead. Further, compression performance is reduced by the necessity to add that side information to the bitstream.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A "STAC Codec," as described herein, provides a simple transform audio coder (i.e., "STAC") that, in various embodiments, operates in either a lossless or near-lossless mode. Note that the term "near-lossless" is used herein to indicate lossy encoding of audio files at a sufficiently high fidelity level that provides generally imperceptible quality degradation (i.e., "perceptually transparent") for human listeners.

In various embodiments, the STAC Codec uses an integer modulated lapped transform (MLT) to transform blocks of time-domain audio signals (of fixed or variable length) into transform coefficients. A backward-adaptive run-length Golomb-Rice (RLGR) encoder is then used to compress the resulting transform coefficients into an encoded bitstream. Further, compression in the transform domain allows the bitstream to be quickly decoded, using the corresponding RLGR decoder, to obtain frequency-domain coefficients. These frequency-domain coefficients can then be directly used to speed up transform-domain based applications including, for example, search, identification, visualization, and transcoding the media to a lossy or other format.

In various lossless embodiments, the STAC Codec achieves further compression gains via an inter-block spectral estimation and data sorting strategy. In various near-lossless embodiments, the STAC Codec achieves additional compression relative to the lossless embodiments, while maintaining perceptual transparency by right-shifting all transform coefficients of each block by some number of bits. In general the number of bits used for right-shifting the transform coefficients should be small enough so that quantization errors are not noticeable as audio artifacts or distortion in the decoded audio signal.

In view of the above summary, it is clear that the STAC Codec described herein provides a unique system and method for encoding/decoding audio files. In addition to the just described benefits, other advantages of the STAC Codec will become apparent from the detailed description that follows hereinafter when taken in conjunction with the accompanying drawing figures.

DESCRIPTION OF THE DRAWINGS

The specific features, aspects, and advantages of the present invention will become better understood with regard to the following description, appended claims, and accompanying drawings where:

DETAILED DESCRIPTION OF THE PREFERRED EMBODIMENTS

In the following description of the preferred embodiments of the present invention, reference is made to the accompanying drawings, which form a part hereof, and in which is shown by way of illustration specific embodiments in which the invention may be practiced. It is understood that other embodiments may be utilized and structural changes may be made without departing from the scope of the present invention.

1.0 Exemplary Operating Environment

Figure 1:
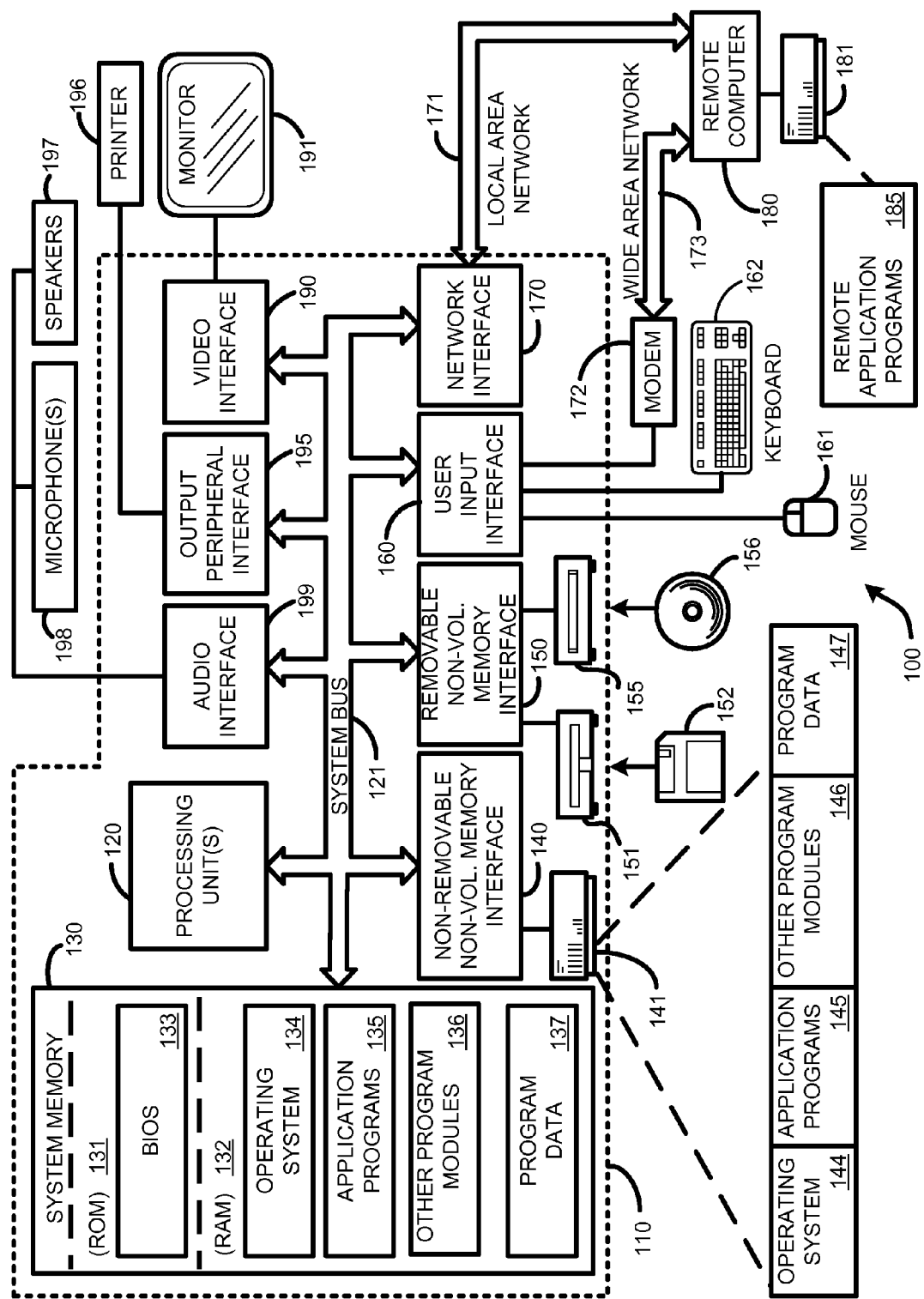
FIG. 1 is a general system diagram depicting a general-purpose computing device constituting an exemplary system for implementing a STAC Codec, as described herein.
Figure 2:
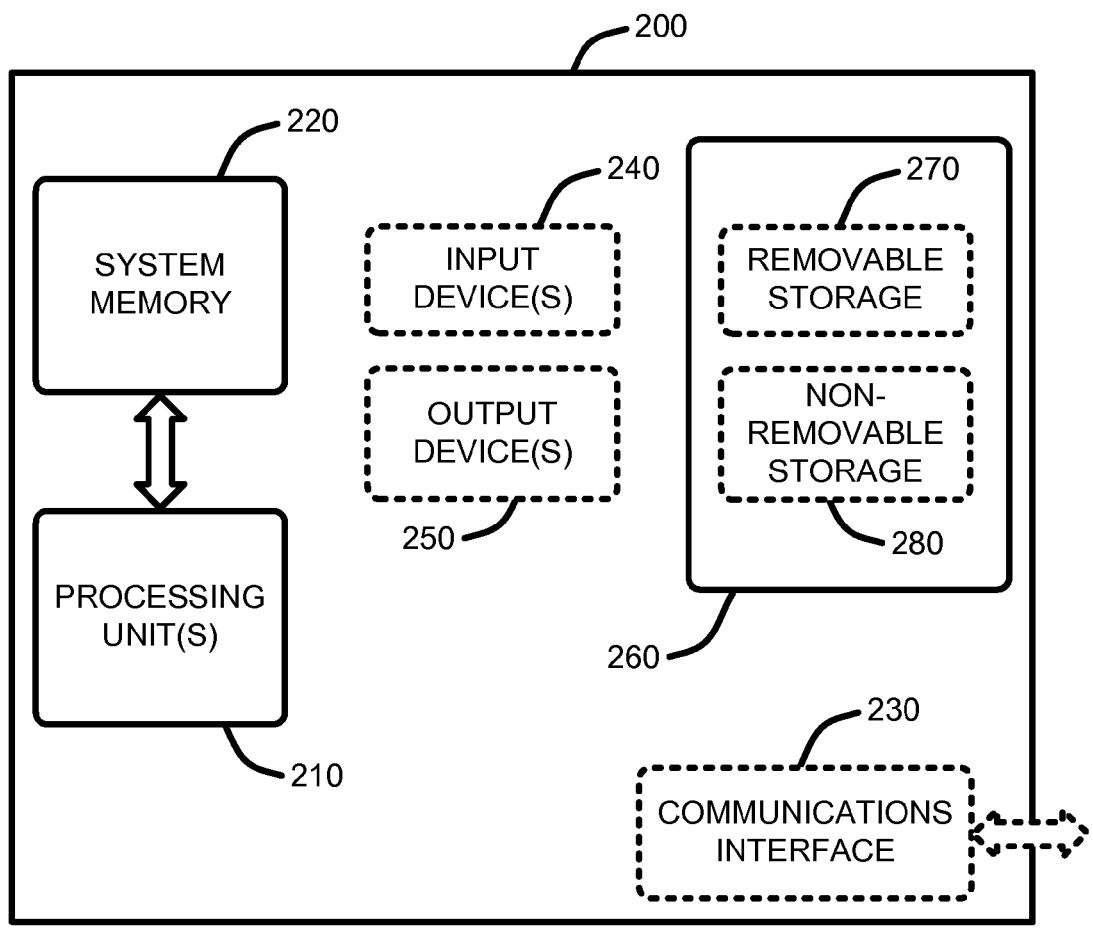
FIG. 2 is a general system diagram depicting a general device having simplified computing and I/O capabilities for use in implementing the STAC Codec, as described herein.

FIG. 1 and FIG. 2 illustrate two examples of suitable computing environments on which various embodiments and elements of a STAC Codec, as described herein, may be implemented.

For example, FIG. 1 illustrates an example of a suitable computing system environment 100 on which the invention may be implemented. The computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

The invention is operational with numerous other general purpose or special purpose computing system environments or configurations. Examples of well known computing systems, environments, and/or configurations that may be suitable for use with the invention include, but are not limited to, personal computers, server computers, hand-held, laptop or mobile computer or communications devices such as cell phones and PDA's, multiprocessor systems, microprocessor-based systems, set top boxes, programmable consumer electronics, network PCs, minicomputers, mainframe computers, distributed computing environments that include any of the above systems or devices, and the like.

The invention may be described in the general context of computer-executable instructions, such as program modules, being executed by a computer in combination with hardware modules, including components of a microphone array 198. Generally, program modules include routines, programs, objects, components, data structures, etc., that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices. With reference to FIG. 1, an exemplary system for implementing the invention includes a general-purpose computing device in the form of a computer 110.

Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 110 typically includes a variety of computer readable media. Computer readable media can be any available media that can be accessed by computer 110 and includes both volatile and nonvolatile media, removable and non-removable media. By way of example, and not limitation, computer readable media may comprise computer storage media such as volatile and nonvolatile removable and non-removable media implemented in any method or technology for storage of information such as computer readable instructions, data structures, program modules, or other data.

For example, computer storage media includes, but is not limited to, storage devices such as RAM, ROM, PROM, EPROM, EEPROM, flash memory, or other memory technology; CD-ROM, digital versatile disks (DVD), or other optical disk storage; magnetic cassettes, magnetic tape, magnetic disk storage, or other magnetic storage devices; or any other medium which can be used to store the desired information and which can be accessed by computer 110.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 1 illustrates operating system 134, application programs 135, other program modules 136, and program data 137.

The computer 110 may also include other removable/non-removable, volatile/nonvolatile computer storage media. By way of example only, FIG. 1 illustrates a hard disk drive 141 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 1, provide storage of computer readable instructions, data structures, program modules and other data for the computer 110. In FIG. 1, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. A user may enter commands and information into the computer 110 through input devices such as a keyboard 162 and pointing device 161, commonly referred to as a mouse, trackball, or touch pad.

Other input devices (not shown) may include a joystick, game pad, satellite dish, scanner, radio receiver, and a television or broadcast video receiver, or the like. These and other input devices are often connected to the processing unit 120 through a wired or wireless user input interface 160 that is coupled to the system bus 121, but may be connected by other conventional interface and bus structures, such as, for example, a parallel port, a game port, a universal serial bus (USB), an IEEE 1394 interface, a Bluetooth™ wireless interface, an IEEE 802.11 wireless interface, etc. Further, the computer 110 may also include a speech or audio input device, such as a microphone or a microphone array 198, as well as a loudspeaker 197 or other sound output device connected via an audio interface 199, again including conventional wired or wireless interfaces, such as, for example, parallel, serial, USB, IEEE 1394, Bluetooth™, etc.

A monitor 191 or other type of display device is also connected to the system bus 121 via an interface, such as a video interface 190. In addition to the monitor, computers may also include other peripheral output devices such as a printer 196, which may be connected through an output peripheral interface 195.

The computer 110 may operate in a networked environment using logical connections to one or more remote computers, such as a remote computer 180. The remote computer 180 may be a personal computer, a server, a router, a network PC, a peer device, or other common network node, and typically includes many or all of the elements described above relative to the computer 110, although only a memory storage device 181 has been illustrated in FIG. 1. The logical connections depicted in FIG. 1 include a local area network (LAN) 171 and a wide area network (WAN) 173, but may also include other networks. Such networking environments are commonplace in offices, enterprise-wide computer networks, intranets, and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 1 illustrates remote application programs 185 as residing on memory device 181. It will be appreciated that the network connections shown are exemplary and other means of establishing a communications link between the computers may be used.

With respect to FIG. 2, this figure shows a general system diagram showing a simplified computing device. Such computing devices can be typically be found in devices having at least some minimum computational capability in combination with a communications interface, including, for example, cell phones PDA's, dedicated media players (audio and/or video), etc. It should be noted that any boxes that are represented by broken or dashed lines in FIG. 2 represent alternate embodiments of the simplified computing device, and that any or all of these alternate embodiments, as described below, may be used in combination with other alternate embodiments that are described throughout this document.

At a minimum, to allow a device to implement the STAC Codec, the device must have some minimum computational capability, and some memory or storage capability. In particular, as illustrated by FIG. 2, the computational capability is generally illustrated by processing unit(s) 210 (roughly analogous to processing units 120 described above with respect to FIG. 1). Note that in contrast to the processing unit(s) 120 of the general computing device of FIG. 1, the processing unit(s) 210 illustrated in FIG. 2 may be specialized (and inexpensive) microprocessors, such as a DSP, a VLIW, or other micro-controller rather than the general-purpose processor unit of a PC-type computer or the like, as described above.

In addition, the simplified computing device of FIG. 2 may also include other components, such as, for example one or more input devices 240 (analogous to the input devices described with respect to FIG. 1). The simplified computing device of FIG. 2 may also include other optional components, such as, for example one or more output devices 250 (analogous to the output devices described with respect to FIG. 1). Finally, the simplified computing device of FIG. 2 also includes storage 260 that is either removable 270 and/or non-removable 280 (analogous to the storage devices described above with respect to FIG. 1).

The exemplary operating environment having now been discussed, the remaining part of this description will be devoted to a discussion of the program modules and processes embodying a "STAC Codec" which provides a unique system and method for encoding/decoding audio files.

2.0 Introduction

A "STAC Codec," as described herein, provides a simple transform audio coder (i.e., "STAC") that, in various embodiments, operates in either a lossless or near-lossless mode to compress audio files. Note that the term "near-lossless" is used herein to indicate lossy encoding of audio files at a sufficiently high fidelity level that provides generally imperceptible quality degradation for human listeners.

In general, the STAC Codec provides lossless audio compression and decompression based on first processing frames of audio samples via a reversible integer transform, such as, for example, an integer-reversible modulated lapped transform (MLT), to produce frequency-domain transform coefficients. These transform coefficients are then encoded using a context-free entropy encoder such as, for example, a backward-adaptive run-length Golomb-Rice (RLGR) encoder to produce a losslessly compressed audio signal. As is known to those skilled in the art, a backward-adaptive RLGR coder is an entropy coder that combines run-length and Golomb-Rice encoding and uses backward adaptation rules that depend only on output codewords of the coder to automatically adjust its coding parameters to nearly optimal values.

Most current state-of-the-art lossless audio codecs employ adaptive prediction techniques followed by adaptive entropy coding techniques. Although such codecs perform quite well and are computationally efficient, they have one major disadvantage: transcoding time. For example, in a typical scenario, a user's music collection is stored in a home server or PC in lossless mode to ensure maximum fidelity. When the user wants to transfer part of the collection to a portable device, a conversion to a lossy format supported by the device is needed because of the device's relatively limited storage capacity. However, most popular lossy codecs operate in the transform domain, so before transfer, each audio track has to be fully decoded from the lossless home storage format and then re-encoded into the lossy format supported by the player.

As noted above, the STAC Codec encodes audio samples in the frequency domain. Consequently, one of the advantages of the STAC Codec is that it provides fast conversion from lossless to lossy or other formats (transcoding) since only partial decoding and re-encoding is needed. In particular, in order to transcode a compressed audio signal that has been encoded by the STAC Codec, entropy decoding is applied to the compressed audio signal to recover the transform coefficients. This frequency-domain data is then directly quantized and entropy encoded into a lossy format (or some other desired format). Consequently, no transforms need to be computed for transcoding operations, resulting in reduced computational overhead, and thus reduced time, with respect to completing transcoding operations.

As a result, operations such as transferring a music collection to a portable device while transcoding that music collection is accomplished in less time that is possible using conventional adaptive prediction based coding techniques. Other transform-domain based applications are also enabled by the STAC Codec, including, for example, audio search functions, audio identification operations, visualization, frequency-domain watermarking, transcoding operations, etc.

2.1 System Overview:

As noted above, the STAC Codec provides audio compression and decompression by using an integer modulated lapped transform (MLT) to transform blocks of time-domain audio signals (of fixed or variable length) into transform coefficients. A backward-adaptive run-length Golomb-Rice (RLGR) encoder is then used to compress the resulting transform coefficients into an encoded bitstream.

In various lossless embodiments, the STAC Codec achieves a compression performance comparable to conventional state-of-the-art lossless audio codecs. However, one advantage of the STAC Codec over conventional codecs is that it generally requires significantly less computational overhead to compress audio files than do conventional transform codecs. In related embodiments, the STAC Codec achieves further compression gains via an inter-block spectral estimation and data sorting strategy.

In various near-lossless embodiments, the STAC Codec achieves additional compression of around a factor of two or so higher in bit rate reduction relative to the lossless embodiments, while maintaining perceptual transparency. In general, this additional compression is achieved by right-shifting all transform coefficients of each block by some fixed number of bits that is small enough so that quantization errors are not noticeable as audio artifacts or distortion in the decoded audio signal. Further, in a related embodiment, the number of right-shifted bits varies with each block to maintain a desired signal-to-noise ratio in the resulting decoded signal. In this case, a side stream is included in the encoded bitstream to indicate the number of shifted bits for each block.

Figure 3:
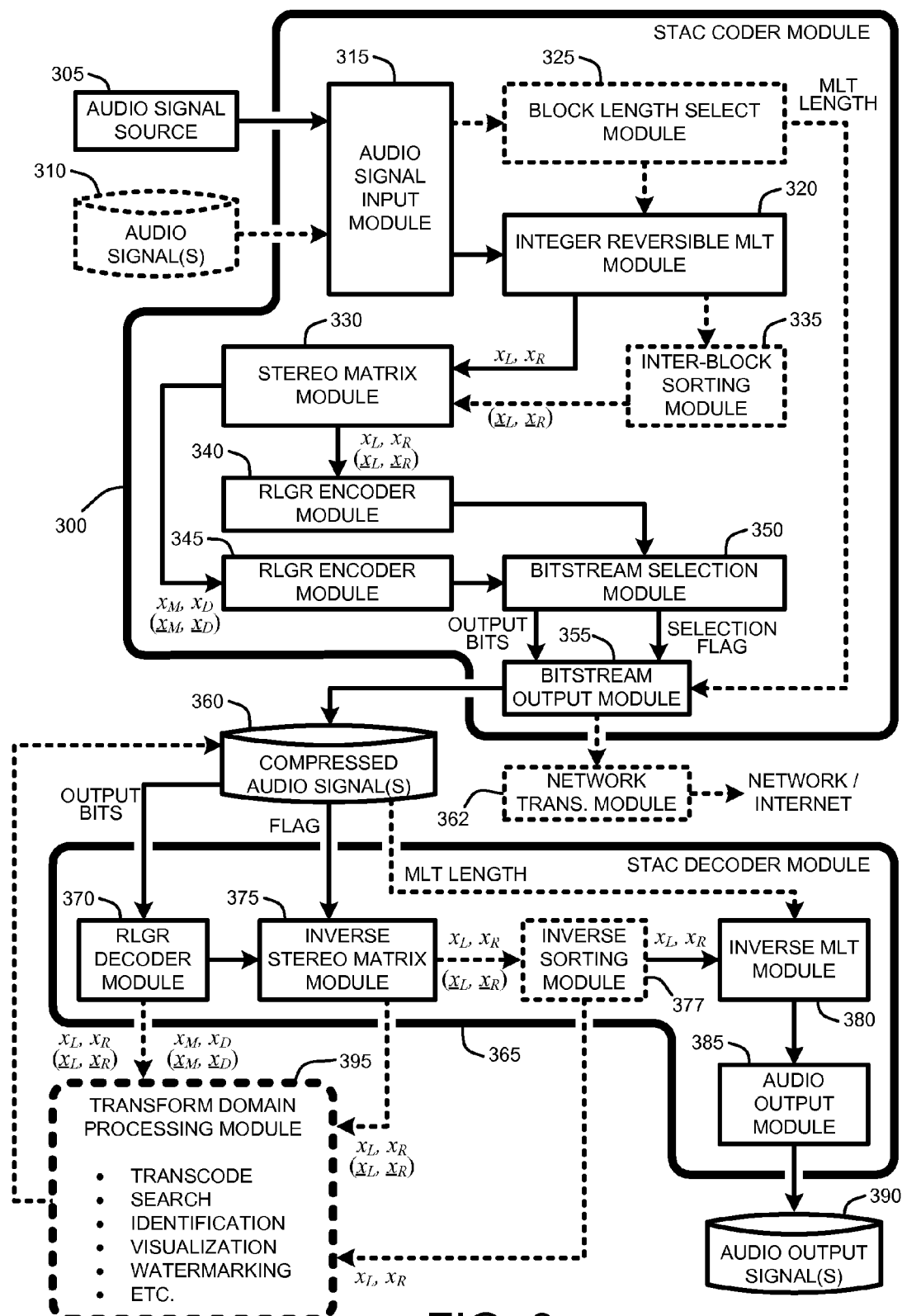
FIG. 3 provides an exemplary architectural flow diagram that illustrates program modules for implementing the STAC Codec, as described herein.

2.2 System Architectural Overview:

The processes summarized above are illustrated by the general system diagram of FIG. 3. In particular, the system diagram of FIG. 3 illustrates the interrelationships between program modules for implementing the STAC Codec, as described herein. It should be noted that any boxes and interconnections between boxes that are represented by broken or dashed lines in FIG. 3 represent alternate embodiments of the STAC Codec described herein, and that any or all of these alternate embodiments, as described below, may be used in combination with other alternate embodiments that are described throughout this document.

Further, it should be noted that while FIG. 3 illustrates the use of a stereo audio signal for encoding/decoding, the STAC Codec is equally capable of encoding/decoding mono audio signals and multi-channel audio signals. However, for purposes of explanation, the stereo channel case is described in the following paragraphs. Extension to either more or fewer channels should be obvious to those skilled in the art in view of the following discussion.

In general, as illustrated by FIG. 3, the STAC Codec begins operation in a STAC coder module 300 by using an audio signal input module 315 to receive an audio signal from either a live audio signal source 305 or a stored audio signal 310. The audio signal input module 315 then provides consecutive overlapping frames of samples of the audio signal to an integer reversible MLT module 320 that transforms each channel of the time-domain audio signal into corresponding blocks of frequency-domain transform coefficients using some predetermined length for the MLT (such as, for example, an integer MLT of length 1024). Consequently, in the case of a stereo audio signal, having left and right channels, the integer reversible MLT module 320 will produce consecutive pairs of frequency-domain transform coefficients, $x_L$ and $x_R$, representing overlapping frames of the left and right channels, respectively.

Further, in one embodiment, the audio signal is first evaluated by a block length select module 325 to determine an optimal MLT block length, on a frame-by-frame basis, for use by the integer reversible MLT module 320. In this case, the optimal MLT block length is provided to the integer reversible MLT module 320 for use in computing the frequency-domain transform coefficients, and also provided as a side stream of bits to be included in a compressed bitstream output representing a compressed audio signal 360. Note that optimal block length selection for MLT processing is known to those skilled in the art, and will not be described in detail herein.

In either case, assuming a stereo signal, once the integer reversible MLT module 320 has computed the transform coefficients for a frame of samples of the audio signal, those coefficients are provided to a stereo matrix module 330 that maps each pair, $\{x_L, x_R\}$, of transform coefficients into a new pair, $\{x_M, x_D\}$ of transform coefficients. This new pair of transform coefficients, $\{x_M, x_D\}$, represents a lifting-based orthogonal approximation of the mean and difference of the left and right channels, respectively. Note that computation of the $\{x_M, x_D\}$ transform coefficients is discussed in more detail in Section 3.2.

Further, in one embodiment, the transform coefficients, $x_L$ and $x_R$, are also provided to an inter-block sorting module 335 that sorts $x_L$ and $x_R$ by computing a bidirectional (and thus reversible) smoothed magnitude spectral estimate over a frequency index of those transform coefficients. The resulting sorted versions of $x_L$ and $x_R$, denoted by $\underline{x}_L$ and $\underline{x}_R$, respectively, are then provided to the stereo matrix module 330 that maps each sorted pair, $\{\underline{x}_L, \underline{x}_R\}$, of transform coefficients into a new pair of coefficients, $\{\underline{x}_M, \underline{x}_D\}$ in the same manner as described above with respect to $\{x_L, x_R\}$ and $\{x_M, x_D\}$. Note that computation of the sorted transform coefficients, $\{\underline{x}_L, \underline{x}_R\}$, is discussed in more detail in Section 3.3 with respect to FIG. 4.

In all cases, one or more RLGR encoders, 340 and 345, are then used to encode each pair of transform coefficient blocks, $\{x_L, x_R\}$ and $\{x_M, x_D\}$, and, if computed, $\{\underline{x}_L, \underline{x}_R\}$ and $\{\underline{x}_M, \underline{x}_D\}$. Note that running multiple RLGR encoders in parallel, one for each pair of transform coefficient blocks, rather than one or more individual RLGR encoders in series to encode each pair of transform coefficient blocks, will reduce total encoding time. However, for purposes of explanation and to reduce the overall complexity of FIG. 3, FIG. 3 illustrates only two RLGR encoders, 340 and 345.

Once the various pairs of transform coefficient blocks have been encoded, a bitstream selection module 350 then evaluates the resulting encoded bitstreams (assuming a stereo channel there are either two or four separate bitstreams, including: direct L-R, mapped M-D, sorted L-R, and sorted mapped M-D), to determine which of the resulting bitstreams is shortest. The shortest encoded bitstream is then sent to a bitstream output module 355 along with a bitstream selection flag (that indicates which bitstream was selected) for use in constructing the final encoded bitstream representing each frame of the corresponding audio samples. Further, as noted above, in one embodiment, the block length selection module 325 selects an optimal block length for processing each frame of audio samples. In this case, the bitstream output module 355 includes this block length as a side stream in the final encoded bitstream for each frame of corresponding audio samples.

The above described processes then continue to repeat for each overlapping frame of audio samples until the entire audio signal has been compressed into the compressed audio signal 360. At this point, the compressed audio signal 360 is either stored for later use, or provided to a STAC decoder module 365 for full or partial decoding. In a related embodiment, rather than storing (360) the compressed bitstream, the bitstream output module 355 provides the compressed bitstream to a network transmission module 362 for transmission across a network, such as the Internet, to one or more receiving devices. Note also that, if desired, these receiving devices can implement the STAC decoder module 365, as described in detail below, for decoding and/or transcoding the received compressed bitstream.

In particular, with respect to full decoding, once the compressed audio signal 360 is provided to the STAC decoder module 365, the STAC decoder module uses an RLGR decoder module 370 to decode consecutive blocks of the incoming bitstream. Note that in this case, there is no need to use multiple RLGR decoder modules 370 since there is only one bitstream to decode (as selected by the bitstream selection module 350).

The output of the RLGR decoder module 370 represents a pair (assuming a stereo audio input) of blocks of transform coefficients, either $\{x_L, x_R\}$ or $\{x_M, x_D\}$, or if sorted via the inter-block sorting module 335, $\{\underline{x}_L, \underline{x}_R\}$ or $\{\underline{x}_M, \underline{x}_D\}$. In either case, the pair of transform coefficients is then provided to an inverse stereo matrix module 375 that either passes the coefficients through without processing (if the pair is $\{x_L, x_R\}$ or $\{\underline{x}_L, \underline{x}_R\}$, or computes either $\{x_L, x_R\}$ or $\{\underline{x}_L, \underline{x}_R\}$ if the pair is $\{\underline{x}_M, \underline{x}_D\}$ or $\{x_M, x_D\}$.

Consequently, regardless of the input transform coefficient pair, the output of the inverse stereo matrix module 375 is either $\{x_L, x_R\}$ or $\{\underline{x}_L, \underline{x}_R\}$, depending upon the specific input pair. Note that the inverse stereo matrix module 375 always knows which pair of transform coefficients it receives since it receives a copy of the corresponding selection flag for each block of coefficients from the compressed audio signal 360.

Next, if the output of the inverse stereo matrix module 375 is $\{x_L, x_R\}$ (i.e., the transforms of a corresponding frame of the left and right channels of the audio signal), those transforms are passed directly to an inverse MLT module 380. However, if the output of the inverse stereo matrix module 375 is $\{\underline{x}_L, \underline{x}_R\}$ (i.e., the sorted transforms of a corresponding frame of the left and right channels of the audio signal), those frames are processed by an inverse sorting module 377 to recover $\{x_L, x_R\}$. Again, the resulting pair of transform coefficient blocks $\{x_L, x_R\}$ is then passed to the inverse MLT module 380.

The inverse MLT module 380 then performs an inverse integer-reversible MLT on $\{x_L, x_R\}$ to directly recover the corresponding frame of the original audio signal. Note that in the case that the block length select module 325 was used to determine optimal MLT lengths for each frame of the audio signal, the corresponding block length is retrieved from the side stream information contained in the compressed audio signal 360 for use in performing the inverse MLT. In either case, the resulting frame of the original audio signal is then passed to an audio output module that recombines resulting overlapping frames of the original audio signal to construct an audio output signal 390 corresponding to the original audio input signal received by the audio signal input module 315.

Further, as noted above, one of the advantages of the STAC Codec is the fact that encoding is performed in the transform domain once audio signals have been transformed from the time domain. Therefore, any operation that can be performed on transform domain coefficients can be performed by only partially decoding the compressed audio signal 360 to recover those transform coefficients without decoding all the way back to the time domain.

Consequently, in one embodiment, the STAC decoder module 365 provides one or more transform coefficients to a transform domain processing module 395 which operates on transform coefficients to perform any of a number of transform-domain based operations, including, for example: transcoding the audio signal to a lossy format or some other format to produce a new compressed audio signal; performing transform-domain based search operations on the transform coefficients to locate particular audio content; identifying audio signals (title, artist, etc.) by evaluating the transform coefficients (i.e., using transform-based audio "fingerprints," or the like); transform-domain based visualization of the audio signal; watermarking of the audio signal by processing one or more transform coefficients to incorporate an identifier into the audio signal for identifying parameters, including but not limited to an audio file source, an audio file title, and an audio file artist, etc.

Further, it should be noted that different transform-domain based applications may require the use of different transform coefficients or transform coefficient pairs (for stereo audio). Consequently, in various embodiments, the transform domain processing module 395 has the capability to pull the transform coefficients from various points (i.e., 370, 375 and/or 377) of the STAC decoder module 365 in order to retrieve any or all of the various available transform coefficient pairs (e.g., $\{x_L, x_R\}$, $\{x_M, x_D\}$, $\{\underline{x}_L, \underline{x}_R\}$, and/or $\{\underline{x}_M, \underline{x}_D\}$, depending upon what transform-domain operation is to be performed. Note that transcoding operations with respect to transform-domain based transcoding from lossless to lossy formats is discussed in greater detail in Section 3.4.

3.0 Operation Overview

The above-described program modules are employed for implementing the STAC Codec. As summarized above, the STAC Codec provides lossless audio compression and decompression by processing an audio signal using and integer-reversible MLT to produce transform coefficients that are then encoded using a backward-adaptive run-length Golomb-Rice (RLGR) encoder to produce a compressed bitstream. The following sections provide a detailed discussion of the operation of the STAC Codec, and of exemplary methods for implementing the program modules described in Section 2 with respect to FIG. 3.

3.1 Operational Details of the STAC Codec:

The following paragraphs detail specific operational and alternate embodiments of the STAC Codec described herein. In particular, the following paragraphs describe details of the STAC Codec operation, including: STAC codec overview; improved compression via inter-block coefficient magnitude estimation; and near-lossless encoding.

3.2 STAC Codec Overview:

In general, the STAC Codec encodes audio data by processing overlapping frames of audio data using integer-reversible MLTs followed by using backward adaptive run-length Golomb-Rice (RLGR) encoders to losslessly compress audio signals, as discussed above with respect to FIG. 3. One of the advantages of the STAC Codec over conventional audio codecs is that by using an integer MLT followed by entropy coding of the resulting transform coefficients, parameter estimation is not required during encoding. Each block is encoded independently, and for stereo signals the block header needs only one parameter value: a single bit indicating if the channels are encoded independently or after a mean/difference-like matrix computation.

For a stereo audio input, the STAC Codec processes each channel of the audio signal into overlapping frames. For example, in a tested embodiment using 50% overlap, each frame had 2M samples, where M represents the MLT block length. For each frame, an integer MLT with M subbands is computed via a matrix lifting algorithm to minimize rounding noise. In one embodiment, the number of subbands was fixed at some integer number, preferably a power of 2, such as, for example, M=1024, to reduce computational overhead. However, as noted above, in various embodiments the block length, M, is automatically determined on a frame-by-frame basis.

As noted above in Section 2.2, once transformed using the integer MLT, the STAC Codec maps the resulting pair of transforms coefficients, $\{x_L, x_R\}$, assuming a stereo signal, into a new pair of coefficients, $\{x_M, x_D\}$, that carry mean and difference information, respectively. However, in contrast to conventional mean-difference computations, the STAC Codec uses a lifting-based orthogonal approximation to reduce dynamic range and thus improve compression performance. This lifting-based orthogonal approximation is illustrated by the set of equations provided below:

$$x_D = x_L - [(ax_R + Q)] >> N$$

$$x_M = x_R + [(cx_D + Q)] >> N$$

$$x_D = x_D - [(ax_M + Q)] >> N \qquad \text{Equation (1)}$$

where the operations are computed in the order shown, N is a fixed shift parameter that should be set as large as possible without leading to overflow, $Q = 2^{N-1}$, $a = \text{round}[2(\sqrt{2}-1)Q]$, and $c = \text{round}[\sqrt{2}Q]$.

Each of the length-M coefficient vectors, $x_L, x_R, x_M,$ and $x_D$ are then encoded using a run-length Golomb-Rice (RLGR) encoder. In contrast to Golomb-Rice (GR) encoders used in typical lossless audio coders, the RLGR encoder used by the STAC Codec is fully backward-adaptive. Consequently, it is not necessary to compute parameters from the input data to be added to the bitstream as side information. Once the STAC Codec has encoded $x_L, x_R, x_M,$ and $x_D$ using one or more RLGR coders, the STAC Codec then chooses the shorter of the encoded bitstreams between the two pairs $\{x_L, x_R\}$ and $\{x_M, x_D\}$, and adds a flag bit to the output bitstream indicating the choice for use in decoding the bitstream.

3.3 Inter-Block Coefficient Magnitude Estimation:

Since total compression is an important factor for audio codecs, in one embodiment, compression levels are further improved using an inter-block sorting technique (see module 335 of FIG. 3), as described in the following paragraphs with respect to FIG. 4.

Figure 4:
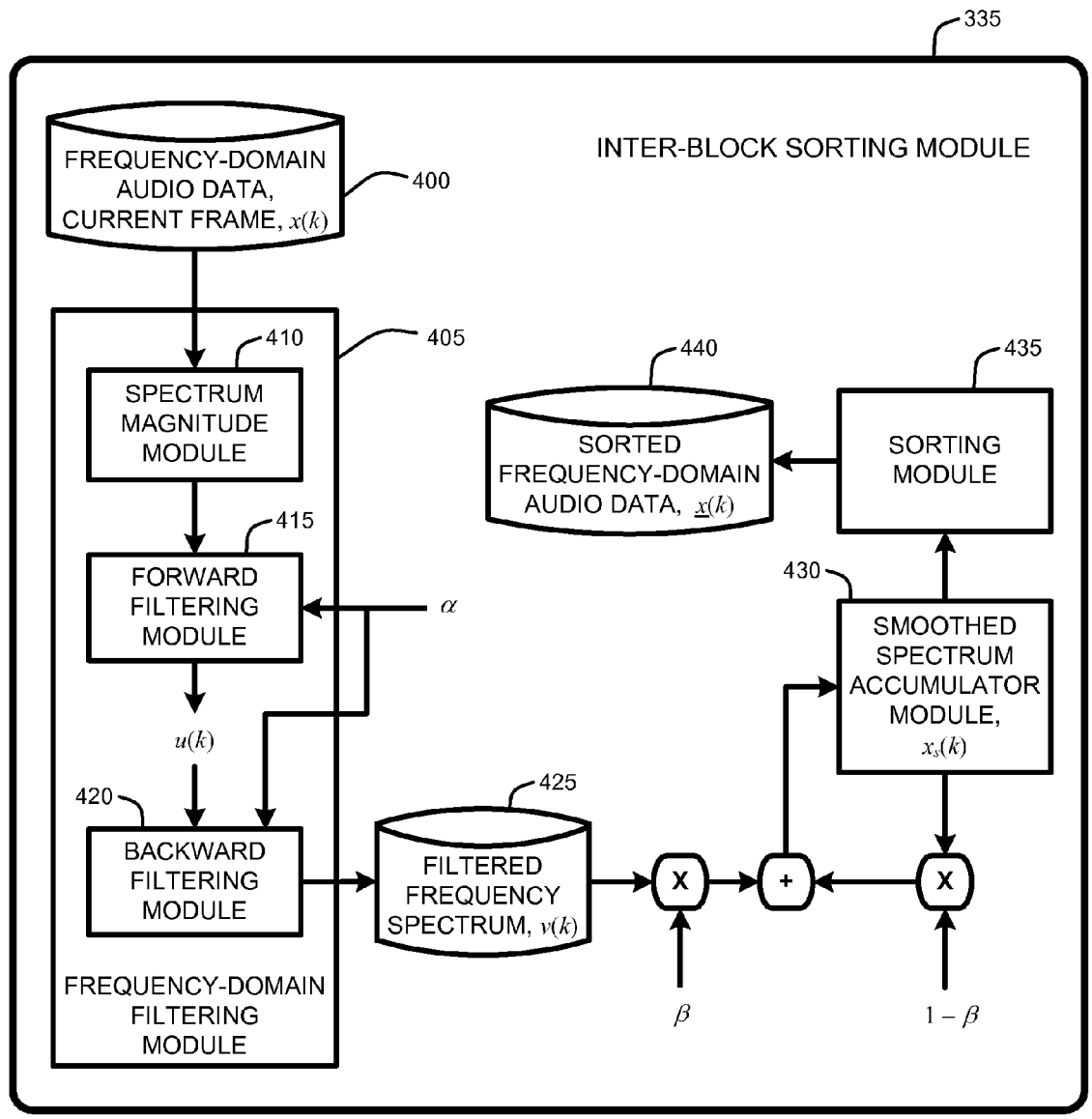
FIG. 4 provides an exemplary layout for implementing inter-block sorting of transform coefficients by computing a reversible bidirectional smoothed magnitude spectral estimate over a frequency index of those transform coefficients for use in implementing various embodiments of the STAC Codec, as described herein.

In particular, as illustrated by FIG. 4, in one embodiment, both the encoder and decoder of the STAC Codec compute a smoothed magnitude spectral estimator $x_S(k)$, where (k=0, 1, . . . , M−1) is the frequency index. Calling $x_L(k)$ and $x_R(k)$ the MLT or frequency domain spectra of the current frame to be encoded, the STAC Codec maps these MLT spectra into their sorted versions, $\underline{x}_L(k)$ and $\underline{x}_R(k)$. Similarly, the STAC Codec also maps $x_M(\overline{k})$ and $x_D(\overline{k})$ into their sorted versions, $x_M(k)$ and $x_D(k)$. Each of these length M coefficient vectors is then encoded using the same RLGR encoders discussed above.

Consequently, in this case, rather than choosing the shorter of the encoded bitstreams between the two pairs $\{x_L, x_R\}$ and $\{x_M, x_D\}$, as in the generic embodiment described in Section 3.2, the STAC Codec chooses the shortest encoded bitstream between four unique pairs, $\{x_L(k), x_R(k)\}$, $\{x_M(k), x_D(k)\}$, $\{x_L(k), x_R(k)\}$, and $\{x_M(k), x_D(k)\}$, corresponding to direct L-R, mapped M-D, sorted L-R, and sorted mapped M-D), respectively. Again, a selection bit or the like is included in the bitstream so that the decoder knows which selection has been made.

The sorting indices are determined by sorting $x_S(k)$ in order of decreasing values. In particular, the idea here is to map the original MLT vectors, including $\{x_L(k), x_R(k)\}$ and $\{x_M(k), x_D(k)\}$, into new vectors with a more rapid decay in magnitudes, since such vectors will compress better, especially where some of the lower magnitude values are zero. Further, since $x_S(k)$ is available at the decoder, no side information (which would inflate the size of the compressed bitstream) on the sorting indices is needed since the decoder can compute the sorting indices directly. In particular, both the encoder and decoder of the STAC Codec update $x_S(k)$ using simple filtering equations such as those illustrated by Equation 2 and Equation 3, wherein:

$$u(k) = \alpha u(k-1) + (1-\alpha)\sqrt{|x_L(k)|^2 |x_R(k)|^2}, k=0, 1, \ldots, M-1$$

$$v(k) = \alpha v(k+1) + (1-\alpha)u_L(k), k = M-2, M-1 \ldots, 0 \quad \text{Equation 2 (Bi-Directional Smoothing)}$$

$$x_S(k) = \beta x_S(k) + (1-\beta)v(k), \quad k=0, 1, \ldots, M-1 \quad \text{Equation 3 (Spectral Estimate Update)}$$

The set of bidirectional smoothing equations illustrated in Equation 2 represent a left-to-right first-order infinite impulse response (IIR) filter followed by a right-to-left first-order IIR filter, with an effective zero phase response (and hence zero delay), controlled by the smoothing parameter $\alpha$. In other words, Equation 2 represents the use of a forward filter followed by a backward filter to compute a filtered frequency spectrum, $v(k)$, for the current frame, $x(k)$. Similarly, the spectral estimate illustrated by Equation 3 is updated via a first-order IIR filter controlled by the parameter $\beta$. In a tested embodiment, it was observed that for most audio tracks, good compression results were achieved with an $\alpha$ value of around approximately 0.25, and a $\beta$ value around approximately 0.55. Further, in one embodiment, the computations in Equation 2 and Equation 3 are scaled so that they're performed in integer arithmetic to further reduce computational overhead.

Note that for the decoder to perform the bidirectional smoothing and spectral updates illustrated by Equation 2 and Equation 3, the decoder needs the current smoothed spectral magnitude estimate $x_S(k)$, which assumes that all previous frames were decoded. Therefore, to allow for efficient seeking (fast forward, rewind, etc.) in the encoded bitstream, $x_S(k)$ is reset to predetermined values (e.g., $x_S(k)=M-k$) at regular intervals of L blocks. Consequently, frames of L blocks can be independently decoded to enable seeking without requiring the entire audio file to be decoded. Further, the ability to periodically reset $x_S(k)$ is useful for addressing the case where one or more blocks may have been lost in the case of streaming media. In a tested embodiment, a value of L of around approximately 94 was selected so that frames of L blocks have a length of about 2 seconds at typical sampling rates of 44.1 kHz or 48 kHz, assuming an MLT length M of 1024.

The processes described above are illustrated by FIG. 4, where the frequency domain transform coefficients 400 of the current frame, $x(k)$, are provided to a frequency domain filtering module 405 that first estimates the magnitude of the spectrum of the coefficients using a spectrum magnitude module 410. Applying bidirectional filtering (i.e., forward filtering module 415 and backward filtering module 420) to the spectrum magnitude estimates using the smoothing parameter, $\alpha$, produces a set of filtered frequency spectrum coefficients 425, $v(k)$. Then, applying the spectral estimate update illustrated by Equation 3, with respect to the filter parameter, $\beta$, via a smoothed spectrum accumulator module 430 produces the smoothed spectral magnitude estimate $x_S(k)$. A sorting module 435 then sorts the smoothed spectral magnitude estimates, $x_S(k)$, to generate the sorted frequency domain data, $\underline{x}(k)$.

3.4 Near-Lossless Encoding:

In terms of overall lossless compression levels, the STAC Codec is comparable to current state of the art encoders. However, one of the advantages of STAC Codec over other codecs is not a small gain in compression, but rather a frequency-domain representation that enables additional processing without full decompression, especially fast transcoding.

For example, if music is ripped from CDs to a personal library in a predictive format and then transferred to a portable music player that uses a transform-based lossy format, the full decoder/encoder for the player format has to be run. However, if the encoder uses an MLT front-end, as it is the case for many formats, then transcoding from the compression format enabled by the STAC Codec would completely eliminate MLT computation time, which usually accounts for around half of the lossy encoding time. Consequently, in this case, transcoding time is decreased by roughly by a factor of two.

Further, in some scenarios, true lossless encoding may not be needed. For example, a 5,000-song music library generally requires about 100 GByte of storage space using lossless coding. However, assuming that a portable media player is limited to something less than 100 GBytes, such as, for example 50 GBytes, the losslessly compressed 5,000-song music library will not fit on the portable media player. However, if a user is willing to use a perceptually transparent lossy encoding, that can provide at least an additional factor of around two in compression levels, then the user can fit the entire 5,000-song music library on the media player.

Many conventional lossy codecs, including, for example, the well known MP3, AAC, and WMA formats achieve compression factor of around 4:1 while still producing a very high fidelity output, making them perceptually transparent. As such, these conventional codecs are useful for fitting large music libraries onto portable music players. However, the high transcoding time noted above is still a problem with such codecs; more specifically, assuming the music library is stored in a personal computer in lossless format, transcoding that library for storage in a portable device (say at around 4:1 compression) would require full decoding of each audio track to its basic time-domain samples and then decoding into MP3, AAC or WMA, because the lossless format is likely to use time-domain predictive coding, while the lossy formats use transform-domain coding. As a result, transferring large libraries (e.g., "syncing" the devices to the library) can take a large amount of time.

Consequently, reduction in transcoding time is an important consideration in the overall user experience with portable media players. In one embodiment, the STAC Codec described herein provides near-lossless encoding for an additional improvement by around a factor of two in overall compression.

In particular, the STAC Codec enables near-lossless compression by right-shifting all transform coefficients of each block by b bits, where b is small enough so that quantization errors are not noticeable. However, rather than just picking some value of b to be used for every block, for blocks with lower energy, it is important to reduce b to maintain a high signal-to-noise ratio. Therefore, in one embodiment, b is varied for each frame in order to maintain a signal-to-noise ration below some predetermined or preferred level. Equation 4 provides one technique for selecting a value of b for each frame:

$$\bar{b} = B + \frac{1}{2}\log_2(\text{mean}\{\chi^2(k)\}) - \delta$$

$$b = \min\{\lfloor B \rfloor, \max\{\lfloor \bar{b} \rfloor, 0\}\}$$

Equation 4 where $\lfloor \cdot \rfloor$ denotes the floor operator, B is a quantization parameter that controls the maximum amount of shift for high-amplitude coefficients, and $\delta$ is a parameter that controls how quickly b is reduced as a function of the block root-mean-square value. While other lossy compression techniques apply data-shifting strategies in the time domain, one advantage of the STAC Codec over other lossy encoders is that the adaptive quantization (shifting) in the frequency domain provided by the STAC Codec produces much less noticeable noise in decompressed audio signals than is produced by quantization in the time domain.

In the scenario discussed above, assuming that the music library is stored in true lossless format using the STAC Codec, transcoding to a near-lossless format can be done very quickly, relative to other conventional codecs. In particular, for each block of the compressed audio signal, the STAC Codec recovers the transform domain data using RLGR decoding. All coefficients in the block are then shifted right by b bits as illustrated by Equation 4, where b is recomputed for each block, and then re-encoded with RLGR. Note that for any block where b=0, no re-encoding is needed since the block has not been changed by right-shifting.

4.0 Operation

Figure 5:
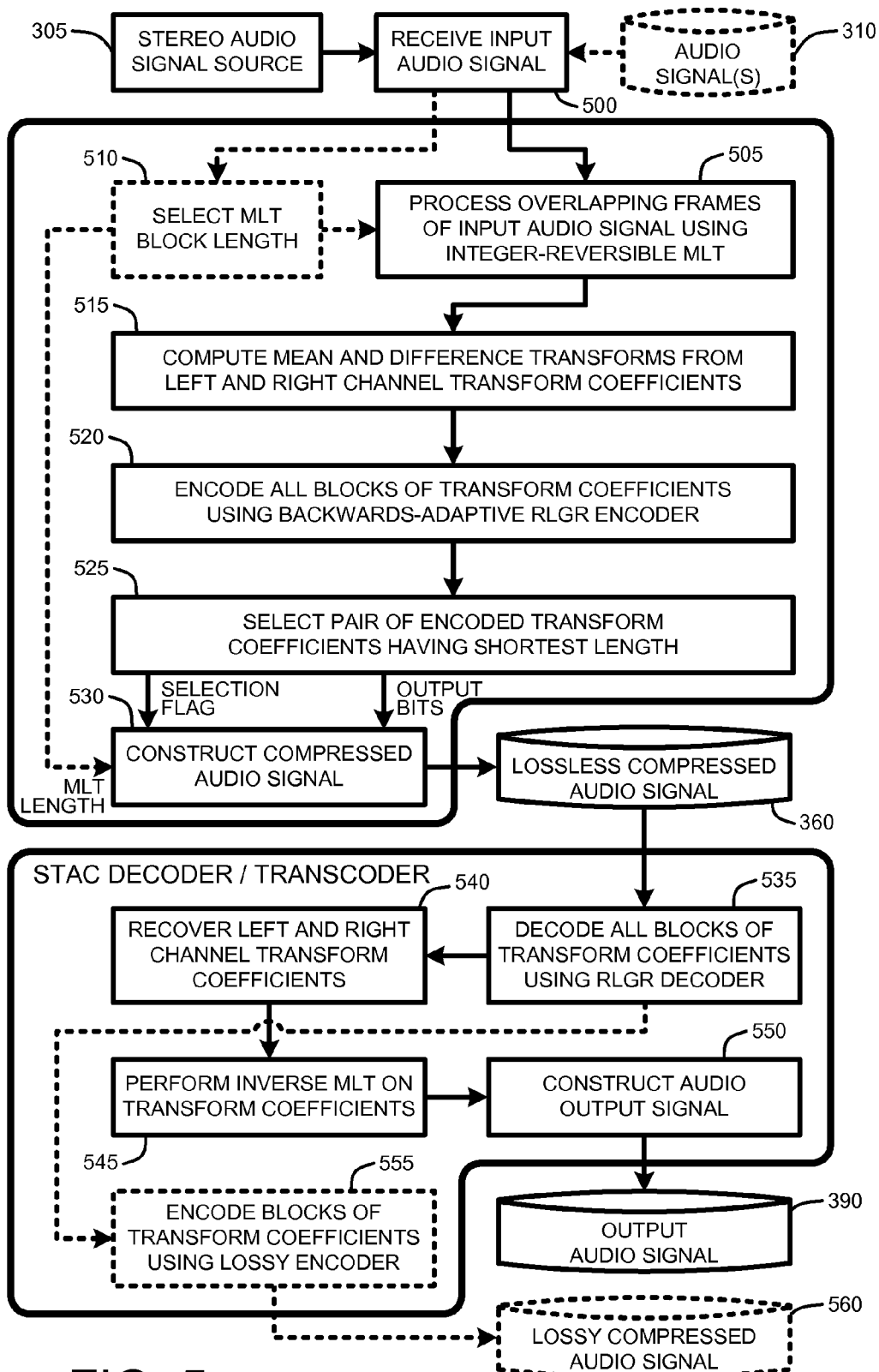
FIG. 5 illustrates a general system flow diagram that illustrates exemplary methods for implementing various embodiments of the STAC Codec, as described herein.

The processes described above with respect to FIG. 3 and FIG. 4, and in further view of the detailed description provided in Sections 2 and 3 are illustrated by the general operational flow diagram of FIG. 5. In particular, FIG. 5 provides an exemplary operational flow diagram which illustrates operation of several embodiments of the STAC Codec. Note that FIG. 5 is not intended to be an exhaustive representation of all of the various embodiments of the STAC Codec described herein, and that the embodiments represented in FIG. 5 are provided only for purposes of explanation. In addition, while the STAC Codec is not limited to processing stereo audio signals, as discussed above, FIG. 5 illustrates processing of a stereo audio signal for purposes of explanation.

Further, it should be noted that any boxes and interconnections between boxes that are represented by broken or dashed lines in FIG. 5 represent optional or alternate embodiments of the STAC Codec described herein, and that any or all of these optional or alternate embodiments, as described below, may be used in combination with other alternate embodiments that are described throughout this document.

In general, as illustrated by FIG. 5, the STAC Codec begins encoding operations by receiving 500 an input audio signal from a live signal source 305 or a recorded signal source 310. Overlapping frames of the input audio signal are then processed 505 using an integer reversible MLT with an optionally variable MLT block length 510.

The resulting transform coefficients for the left and right channels of the stereo audio input signal are then processed to compute 515 a lifting-based orthogonal approximation of the mean and difference of the left and right channels, respectively. Each pair of transform coefficient blocks, e.g., $\{x_L, x_R\}$ and $\{x_M, x_D\}$, are then encoded 520 using a backwards-adaptive RLGR encoder.

The STAC Codec then evaluates the resulting pairs of encoded transforms to select 525 the pair having the shortest bitstream. The encoded transform pair having the shortest bitstream is then used, along with a flag indicating which pair was selected, to construct 530 the losslessly compressed audio signal 360.

Given this losslessly compressed audio signal 360, the STAC Codec then either partially or fully decodes that compressed audio signal to perform various tasks.

For example, in order to recover the original audio file for playback or other uses, the STAC Codec decodes 535 all blocks of transform coefficients from the losslessly compressed audio signal 360 using an RLGR decoder, which basically performs the inverse of the original RLGR encoding 520.

Once the transform coefficients have been decoded, the STAC Codec recovers 540 the left and right channel transform coefficients, if necessary (assuming that encoded mean and difference of the left and right channels was selected as providing the shortest bitstream). The STAC Codec then performs 545 the inverse of the MLT that was performed 505 when originally encoding the input audio signal. The result of this inverse MLT 545 provides overlapping frames of the original input audio signal which are then used to construct the 550 the output audio signal 390 for playback or other uses.

With respect to partial decoding, the STAC Codec enables a number of applications, such as those described in Sections 2 and 3. For example, as illustrated by FIG. 5, in the case where a user wants to transcode the losslessly compressed audio signal 360 from the lossless format to another format, such as a lossy format, the STAC Codec begins operation as if was going to fully decode the signal.

For example, when transcoding the losslessly compressed audio signal 360, to a lossy format, the STAC Codec decodes 535 all blocks of transform coefficients from the losslessly compressed audio signal using an RLGR decoder, which basically performs the inverse of the original RLGR encoding 520. However, unlike the full decoding example, once the transform coefficients have been decoded 540, the STAC Codec then re-encodes 555 those blocks of transform coefficients using a transform-domain lossy encoder, such as the variable shift lossy encoder described in Section 3.4. The resulting encoded blocks are then used to construct a lossy compressed audio signal 560 which is stored for later use, as desired.

The foregoing description of the STAC Codec has been presented for the purposes of illustration and description. It is not intended to be exhaustive or to limit the invention to the precise form disclosed. Many modifications and variations are possible in light of the above teaching. Further, it should be noted that any or all of the aforementioned alternate embodiments may be used in any combination desired to form additional hybrid embodiments of the STAC Codec. It is intended that the scope of the invention be limited not by this detailed description, but rather by the claims appended hereto.

What is claimed is:

1. A system for losslessly compressing an audio signal, comprising:
a device for receiving an input audio signal having at least a left channel and a right channel;
a device for processing overlapping frames of the input audio signal using an integer-reversible modulated lapped transform (MLT) to produce a block of transform coefficients for each frame of each channel;
a device for reversibly computing a block of mean transform coefficients and a block of difference transform coefficients from each corresponding block of transform coefficients computed for the left and right audio channels;
a device for encoding each block of transform coefficients using a backward-adaptive run-length Golomb-Rice (RLGR) encoder, wherein encoding each block of transform coefficients using the RLGR encoder further includes encoding the blocks of mean transform coefficients and difference transform coefficients; and
a device for constructing a losslessly compressed output data stream representing the input audio signal by sequentially compositing the RLGR encoded blocks of transform coefficients for every frame of the input audio signal, said output data stream being any of stored on a physical computer readable medium and transmitted across a network to one or more receiving devices.

2. The system of claim 1 further comprising a device for determining a variable block length on a frame-by frame basis for every frame of the input signal, and wherein the integer-reversible MLT uses those variable block lengths.

3. The system of claim 1 further comprising a device for sorting the transform coefficients comprising each block of transform coefficients by computing a bidirectional smoothed magnitude spectral estimate over a frequency index of the transform coefficients prior to encoding the transform coefficients using the RLGR encoder.

4. The system of claim 1 further comprising a device for transcoding the output data stream to a lossy format by:
partially decoding the output data stream to recover the transform domain coefficients that were encoded by the RLGR encoder; and
encoding each block of recovered transform domain coefficients using a lossy encoder to construct a lossy output data stream representing a lossy version of the original input audio signal.

5. The system of claim 4 wherein encoding each block of recovered transform domain coefficients using the lossy encoder comprises:
a device for right shifting the transforms in each block of transform coefficients by an automatically computed number of bits; and
a device for encoding the resulting right-shifted blocks of transforms using the RLGR encoder.

6. The system of claim 1 wherein sequentially compositing the RLGR encoded blocks of transform coefficients for every frame of the input audio signal comprises:
a device for selecting a shortest pair of encoded transform coefficients for each frame of the input audio signal from a first pair of encoded transform coefficients and a second pair of encoded transform coefficients;
wherein the first pair of encoded transform coefficients corresponds to the transform coefficients computed from the left and right channels of the audio signal; and
wherein the second pair of encoded transform coefficient corresponds to the blocks of mean transform coefficients and difference transform coefficients.

7. A method for encoding an audio signal, comprising using a computing device to:
receive a stereo audio signal having a left and right audio channel;
process sequential overlapping frames of samples of the stereo audio signal using an integer-reversible modulated lapped transform (MLT) to compute a block of transform coefficients for each frame of the left and right audio channels;
reversibly compute a block of mean transform coefficients and a block of difference transform coefficients from each corresponding block of transform coefficients computed for the left and right audio channels;
encode all of the blocks of transform coefficients using a backward-adaptive run-length Golomb-Rice (RLGR) encoder;
evaluate a first pair of encoded transform coefficients corresponding to the RLGR encoded blocks of transform coefficients computed for the left and right audio channels, and a second pair of encoded transform coefficients corresponding to the RLGR encoded blocks of transform coefficients computed for the block of mean transform coefficients and the block of difference transform coefficients to determine which pair of RLGR encoded blocks of transform coefficients is represented by a shortest bitstream;
construct a losslessly compressed output data stream representing the stereo audio signal by sequentially compositing the shortest bitstreams corresponding to either the first pair or the second pair of RLGR encoded blocks of transform coefficients for every frame of the stereo audio signal; and
storing the output data stream on a computer-readable storage device.

8. The method of claim 7 wherein the integer-reversible MLT uses a variable block length that is automatically determined on a frame-by-frame basis for every frame of the stereo audio signal.

9. The method claim 7 further comprising sorting the transform coefficients comprising each block of transform coefficients by computing a bidirectional smoothed magnitude spectral estimate over a frequency index of the transform coefficients prior to encoding the transform coefficients using the RLGR encoder.

10. The method of claim 9 wherein encoding all of the blocks of transform coefficients using the RLGR encoder comprises encoding all non-sorted versions of the transform coefficients and all sorted versions of the transform coefficients.

11. The method of claim 10 wherein constructing the losslessly compressed output data stream further comprises:
selecting from any of the first and second pairs and a third and fourth pair of encoded transform coefficients for sequentially compositing the shortest bitstreams corresponding to any of the first, second, third, or fourth pair of RLGR encoded blocks of transform coefficients for every frame of the stereo audio signal;
wherein the third pair of encoded transform coefficients corresponds to the sorted version of the transform coefficients computed for the left and right audio channels; and wherein the fourth pair of encoded transform coefficients corresponds to the sorted version of the transform coefficients computed for the block of mean transform coefficients and the block of difference transform coefficients.

12. The method of claim 7 further comprising transcoding the output data stream to a lossy format by:
  partially decoding the output data stream to recover the transform domain coefficients that were encoded by the RLGR encoder; and
  encoding each block of recovered transform domain coefficients using a lossy encoder to construct a lossy output data stream representing a lossy version of the original stereo audio signal.

13. The method of claim 12 wherein encoding each block of recovered transform domain coefficients using the lossy encoder comprises:
  right shifting the transforms in each block of transform coefficients by an automatically computed number of bits; and
  encoding the resulting right-shifted blocks of transforms using the RLGR encoder.

14. A process for decoding compressed audio data, comprising steps for:
  receiving compressed audio data comprising encoded blocks of transform domain coefficients from a computer-readable storage device;
  decoding the encoded blocks of transform coefficients using a backward-adaptive run-length Golomb-Rice (RLGR) decoder to recover transform coefficients corresponding to left and right audio channels of a stereo audio signal, and to further recover blocks of mean transform coefficients and difference transform coefficients that were reversibly computed from each corresponding block of transform coefficients prior to encoding those blocks of transform coefficients using a backward-adaptive RLGR encoder;
  applying an inverse integer-reversible modulated lapped transform (MLT) to the recovered transform coefficients to recover time domain signals corresponding to each of the one or more audio channels; and
  combining the time domain audio signals to create an output audio signal.

15. The process of claim 14 wherein an inverse sorting is applied to the recovered transform coefficients prior to applying the inverse integer-reversible MLT to the recovered transform coefficients.

16. The process of claim 15 wherein a bidirectional inter-block spectral estimator recovered from the compressed audio data is used to guide the inverse sorting of recovered transform coefficients.

17. The process of claim 14 wherein the inverse integer-reversible MLT uses a variable block length that is recovered from the compressed audio data on a frame-by-frame basis for every frame of the compressed audio signal.

18. The process of claim 14 further comprising storing the output audio signal on a computer readable medium.

19. The process of claim 14 further comprising providing a playback of the output audio signal on an audio playback device.

* * * * *